United States Patent [19]

Fukumoto et al.

[11] Patent Number: 5,528,160
[45] Date of Patent: Jun. 18, 1996

[54] SPACING FRAME STRUCTURE FOR IC HANDLER

[75] Inventors: Keiichi Fukumoto, Kitamoto; Noriyuki Igarashi, Gyoda, both of Japan

[73] Assignee: Advantest Corporation, Tokyo, Japan

[21] Appl. No.: 296,227

[22] Filed: Aug. 25, 1994

[30] Foreign Application Priority Data

Aug. 25, 1993 [JP] Japan .................................. 5-050780

[51] Int. Cl.$^6$ .................................................... G01R 31/02
[52] U.S. Cl. ........................... 324/760; 324/755; 324/754
[58] Field of Search ..................................... 324/760, 755, 324/754

*Primary Examiner*—Kenneth A. Wieder
*Assistant Examiner*—Kourosh Cyrus Khosravi
*Attorney, Agent, or Firm*—Knobbe, Martens, Olson & Bear

[57] ABSTRACT

An improved structure for a spacing frame for interfacing a test head of an IC tester and an IC handler wherein the spacing frame can be changed in a short period of time without moving the test head of the IC tester or the IC handler. The spacing frame and the temperature chamber provide a unique structure which is capable of inserting and replacing the spacing frame within a vertical space in the chamber and locking the spacing frame in the predetermined position in the chamber. The spacing frame structure includes a spacing frame body to interface the IC handler and the IC tester which has a socket guide at its top which is horizontally extended from the body and a flange at its middle portion, a temperature chamber having an opening for receiving said spacing frame body therein, a performance board connected to a bottom of the spacing frame body for providing electric signals from the IC device to be tested to the IC tester, an IC socket for receiving the IC device to be tested therein, and a locking mechanism to provide a vertical movement to the spacing frame body such that the spacing frame body is free when it is in an upper position and is locked when it is in a lower position.

8 Claims, 4 Drawing Sheets

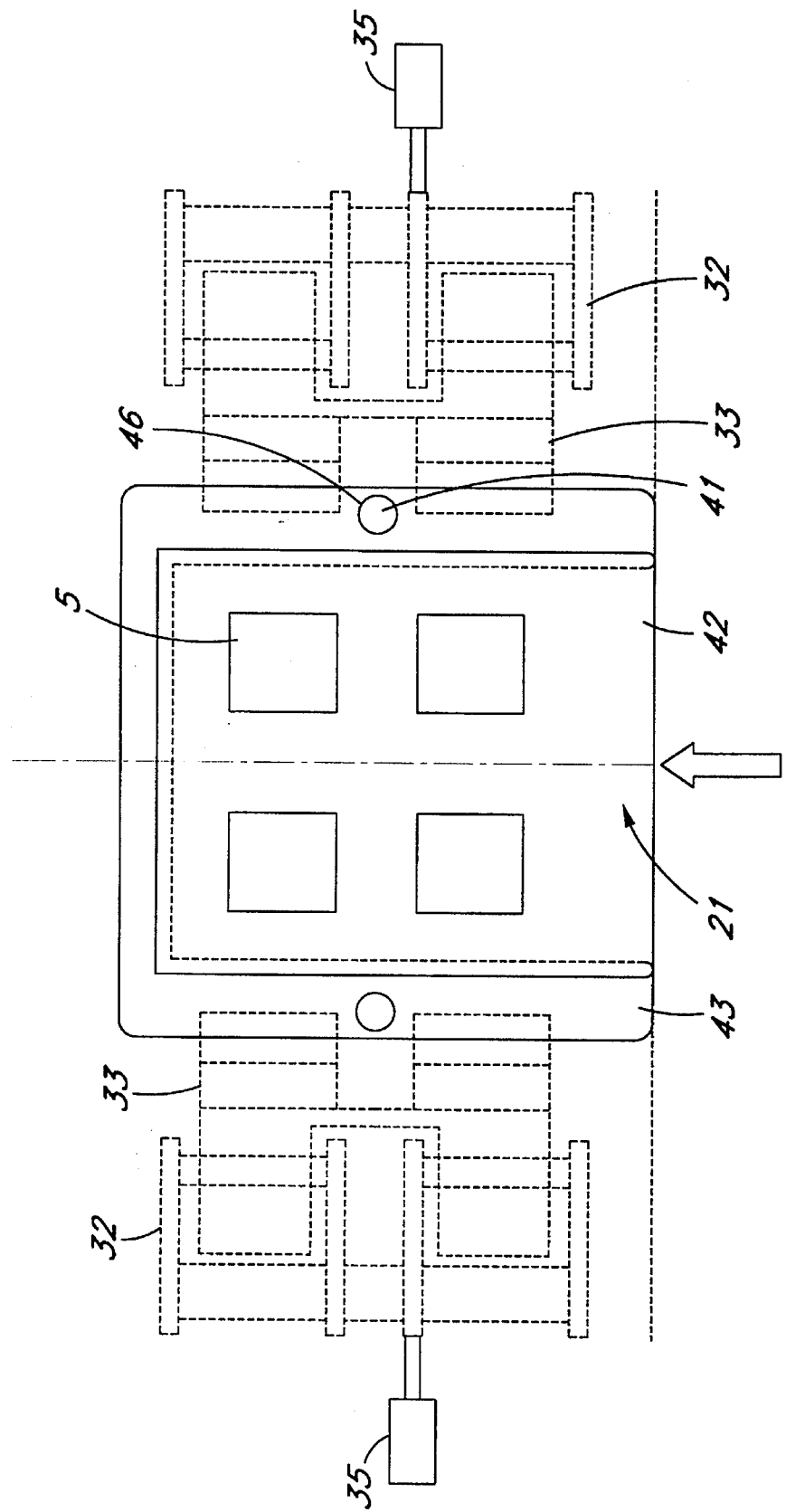

SPACING FRAME STRUCTURE FOR IC HANDLER

FIELD OF THE INVENTION

The present invention relates to a spacing frame for an IC handler that connects the IC handler with a test head of an IC tester, and more particularly to an improved structure of an interface between the IC handler and the IC tester wherein the spacing frame can be replaced without moving the test head of the IC tester or the IC handler.

BACKGROUND OF THE INVENTION

In testing a large number of IC devices, an IC handler and an IC tester interact to realize efficient and accurate testing. The IC tester provides test signals to IC devices arranged on a test head of the IC tester and analyzes the resulting signals from the IC devices under test. The IC handler automatically provides IC devices to be tested to the test head of the IC tester. The IC handler usually includes a temperature chamber so that the IC devices can be tested by the IC tester under the predetermined temperature conditions. In such a situation, an interfacing member (hereinafter referred to as "spacing frame") is employed to connect the test head of the IC tester and the IC handler.

FIG. 3 illustrates an example of conventional vertical-type spacing frames. The left hand side of FIG. 3 is an IC handler while the right hand side thereof is an IC tester. The IC handler of FIG. 3 is useful in providing IC devices to be tested to a test head of an IC tester by the gravity of the IC devices since the devices to be tested can shift its position in a vertical direction. For an IC handler which does not utilize the self-gravity of the IC devices to be tested, a horizontal-type spacing frame can be applicable wherein the IC handler is positioned in the upper side of the spacing frame while the IC tester is positioned in the lower side of the spacing frame.

In the vertical-type of FIG. 3, a spacing frame 1 usually includes one or more IC sockets 5 to mount IC devices to be tested thereon. The spacing frame 1 electrically connects the IC sockets 5 facing to a temperature chamber 10 of the IC handler with a test head 4 and thermally intercepts air from the chamber. In operation, the IC devices to be tested are automatically positioned and inserted in the IC sockets 5 by a mechanism in the IC handler.

In the conventional structure of FIG. 3, the spacing frame 1 is mounted to the IC handler in advance. The test head 4 is positioned and moved to the IC handler little by little until the spacing frame 1 contacts a seal 13 of a heat-insulated wall 11 which is a part of the temperature chamber of the IC handler. After that, the spacing frame 1 is fixed to the IC handler with clamps 12 using, for example, air cylinders 15. The IC socket 5 faces the temperature chamber 10 so that an IC device can be tested under a predetermined temperature environment. In this arrangement, the IC device to be tested and the test head of the IC tester are electrically connected through the IC socket 5 and a performance board 16.

In the testing structure using an IC handler and an IC tester, a spacing frame has to be changed when testing a different kind of IC devices because the different kind of IC requires a different type of IC socket and also different structure of performance board. In such a situation, in the conventional spacing frame structure shown in FIG. 3, the spacing frame has to be replaced by moving the test head of the IC tester or the IC handler so that the test head and the IC handler apart from each other. This movement is necessary because the spacing frame is directly mounted on the test head and directly contacts the temperature chamber of the IC handler. Usually, in such a case, a user moves the test head rather than the IC handler since the IC handler is heavier than the test head of the IC tester.

Since the IC tester and the IC handler are usually very large and heavy system, and also require a precise positioning with each other, it takes a relatively long time, for example, ten to fifteen minutes, to change the spacing frame in the conventional spacing frame structure. Therefore, there is a need to improve the spacing frame structure to reduce the time required in exchanging the spacing frame when testing a different kind of IC devices.

SUMMARY OF THE INVENTION

It is therefore an object of the present invention to provide an improved structure for a spacing frame for interfacing a test head of an IC tester and an IC handler wherein the spacing frame can be changed in a short period of time without moving the test head of the IC tester or the IC handler. The spacing frame and the temperature chamber of the present invention provide a unique structure which is capable of inserting and replacing the spacing frame within a vertical space in the chamber and locking the spacing frame in the predetermined position in the chamber.

To realize the above-mentioned object, a horizontal-type spacing frame according to the present invention has a structure that the spacing frame can be inserted to or removed from a temperature chamber of the IC handler in parallel with a surface of the test head. The spacing frame has a socket guide at its top for mounting one or more IC sockets for receiving an IC device to be tested. The socket guide also functions as a temperature sealing between the temperature chamber and the test head. The spacing frame also includes a horizontal flange in its intermediate position for guiding the frame in the temperature chamber and positioning the frame in the chamber. The flange is provided with a guide hole for positioning the spacing frame within the temperature chamber.

At the bottom of the spacing frame, a performance board is attached. The performance board has a plurality of electrodes at its bottom which are electrically connected to the IC socket. The electrodes will be electrically connected to a plurality of contact pins on the test head of the IC tester when the spacing frame is attached to the IC handler in accordance with the attachment procedure of the present invention.

The temperature chamber of the IC handler includes a chamber base which meets with the socket guide of the spacing frame and a main base which receives the flange of the spacing frame. Both the chamber base and the main base have an opening or a cut out portion to receive the spacing frame of the present invention. Between the chamber base and the main base there is provided clamp cams and clamp hooks to fix the spacing frame to the temperature chamber. The main base of the chamber also include a guide pin for accurately positioning the spacing frame in the temperature chamber so that the performance board at the bottom of the spacing frame also accurately positioned with respect to the test head of the IC tester.

When the spacing frame is inserted in the temperature chamber, the guide pin is inserted in the guide hole provided on the flange of the spacing frame. In the temperature chamber, the spacing frame can be moveable in a vertical direction within a range determined by the distance between the chamber base and the main base, and also the distance between the socket guide and the flange. The clamp cams and the clamp hooks in the chamber are utilized to drive the spacing frame in the vertical direction in the temperature chamber. The clamp cams and the clamp hooks also lock the spacing frame to accurately fix the spacing frame with respect to the test head of the IC tester.

According to the structure of the present invention, it is possible to remove the spacing frame from the test head and the temperature chamber by releasing the clamp hooks through the clamp cams so that the spacing frame can be free within the temperature chamber. When the spacing frame is set free in the chamber by unlocking the clamp hooks, the spacing frame is then horizontally, i.e., in parallel with the surface of the test head, taken out from the chamber to be replaced with another spacing frame for a different kind of IC devices. Therefore, when the spacing frame has to be replaced for testing a different kind of IC devices, it can be accomplished within a short period of time, such as one or two minutes.

BRIEF DESCRIPTION OF THE DRAWINGS

FIGS. 2a and 2b are a top view and a front view, respectively, of the spacing frame of the present invention for showing a locking mechanism.

DETAILED DESCRIPTION OF THE INVENTION

Figure 1A:
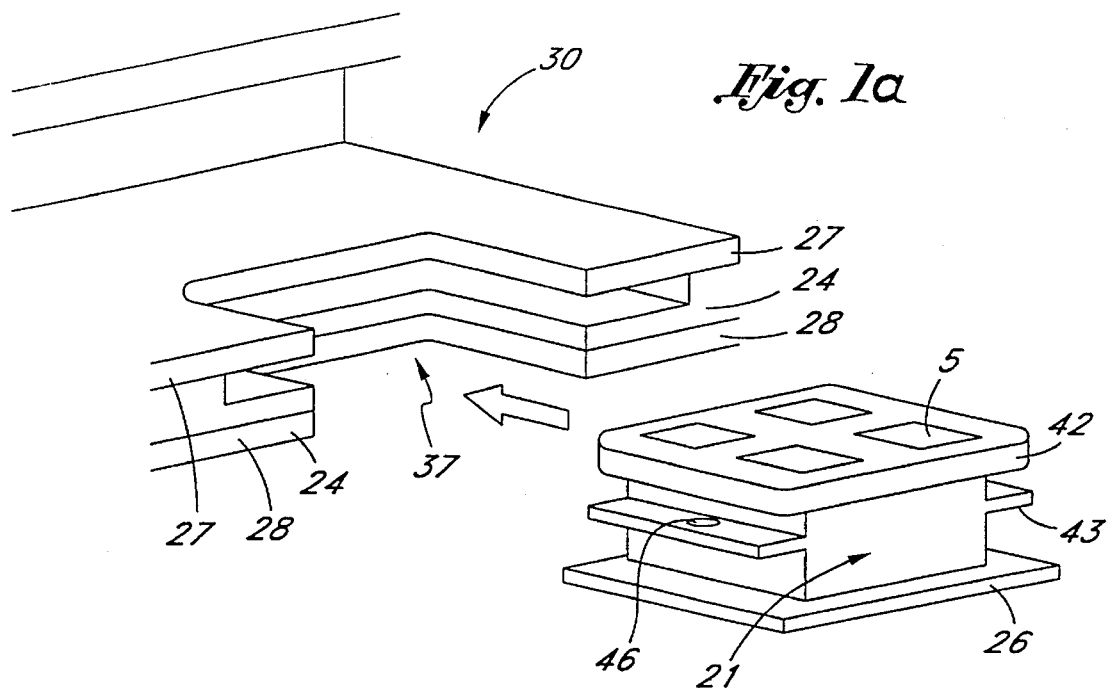
FIG. 1a is a perspective view showing the spacing frame structure of the present invention.
Figure 1B:
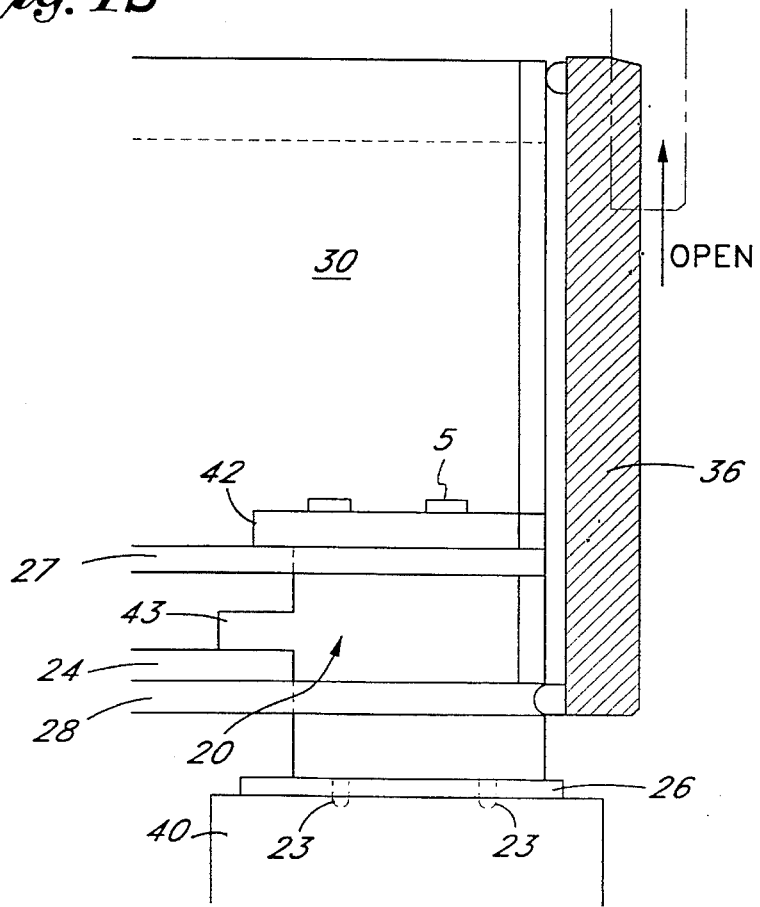
FIG. 1b is a side view of the spacing frame structure of FIG. 1.

Referring to FIGS. 1a and 1b and also FIGS. 2a and 2b, one of the preferred embodiments of the present invention will be described.

FIG. 1a is a perspective view of the embodiment for showing the structure of the spacing frame of the present invention. A temperature chamber 30 forms a part of an IC handler to provide a predetermined temperature atmosphere to IC devices to be tested. Although not shown, the lower part of FIG. 1a is a test head of an IC tester. An upper part of the temperature chamber 30 is a room for providing a predetermined temperature to IC devices to be tested.

The temperature chamber 30 comprises a chamber base 27 and a main base 28 in the side closer to a test head 40 (FIG. 1b) of an IC tester. Preferably, there is provide a heat insulator between the chamber base 27 and the main base 28. The temperature chamber 30 has an opening 37, as shown in FIG. 1a, which is a cut-out in the chamber base 27 and the main base 28 to accommodate a spacing frame of the present invention. Although not shown in FIG. 1a, there is provided a mechanism for positioning and fixing the spacing frame 21, which will be described in detail later.

A spacing frame 21 has a socket guide 42 at its top which is mounted with one or more IC sockets 5. The socket guide 42 protrudes in a horizontal direction which forms a temperature sealing in combination with the chamber base 27 when the spacing frame 21 is inserted in the opening 37. The IC sockets 5 accept the IC devices to be tested which will be automatically provided by the IC handler. The spacing frame 21 has a flange 43 at its intermediate portion which will be inserted between the chamber base 27 and the main base 28 of the temperature chamber 30. The flange 43 has a guide hole 46 to accurately positioning the spacing frame in the temperature chamber with respect to the test head.

At the bottom of the spacing frame, a performance board 26 is attached. The performance board 26 has a plurality of electrodes at its bottom which are electrically connected to socket pins of the IC sockets through wires, for example. When the spacing frame 21 is attached to the temperature chamber 30 of the IC handler, the electrodes will be electrically connected to a plurality of contact pins on the test head of the IC tester.

The spacing frame 21 is inserted in the opening 37 of the temperature chamber 30 as shown by an arrow of FIG. 1a. FIG. 1b is a schematic side view of the spacing frame structure of the present invention for explaining the process of installing the spacing frame 21 in the temperature chamber 30. As shown in FIG. 1b, first, a chamber cover 36 of the temperature chamber 30 is opened to insert therein the spacing frame 21. The spacing frame 21 is inserted in the temperature chamber 30 in parallel with a surface of the test head 40 to a direction of the arrow in FIG. 1a. In this insertion process, since there is an enough space between the surface of the test head 40 and the bottom of the performance board 26 attached to the spacing frame 21, the spacing frame can be easily moveable without any significant force. Preferably, guide pins 23 are provided at the bottom of the performance board to positioning the performance board with respect to the contact pins on the test head.

After being completely inserted in the temperature chamber 90, the spacing frame 21 is pressed downward by a mechanism provided in the temperature chamber 30 to fix the spacing frame in the accurate position. Such a locking mechanism is shown in FIGS. 2a and 2b which will be described in detail below. Finally, the chamber cover 26 shown in FIG. 1b is closed to start the IC testing.

Figure 2B:
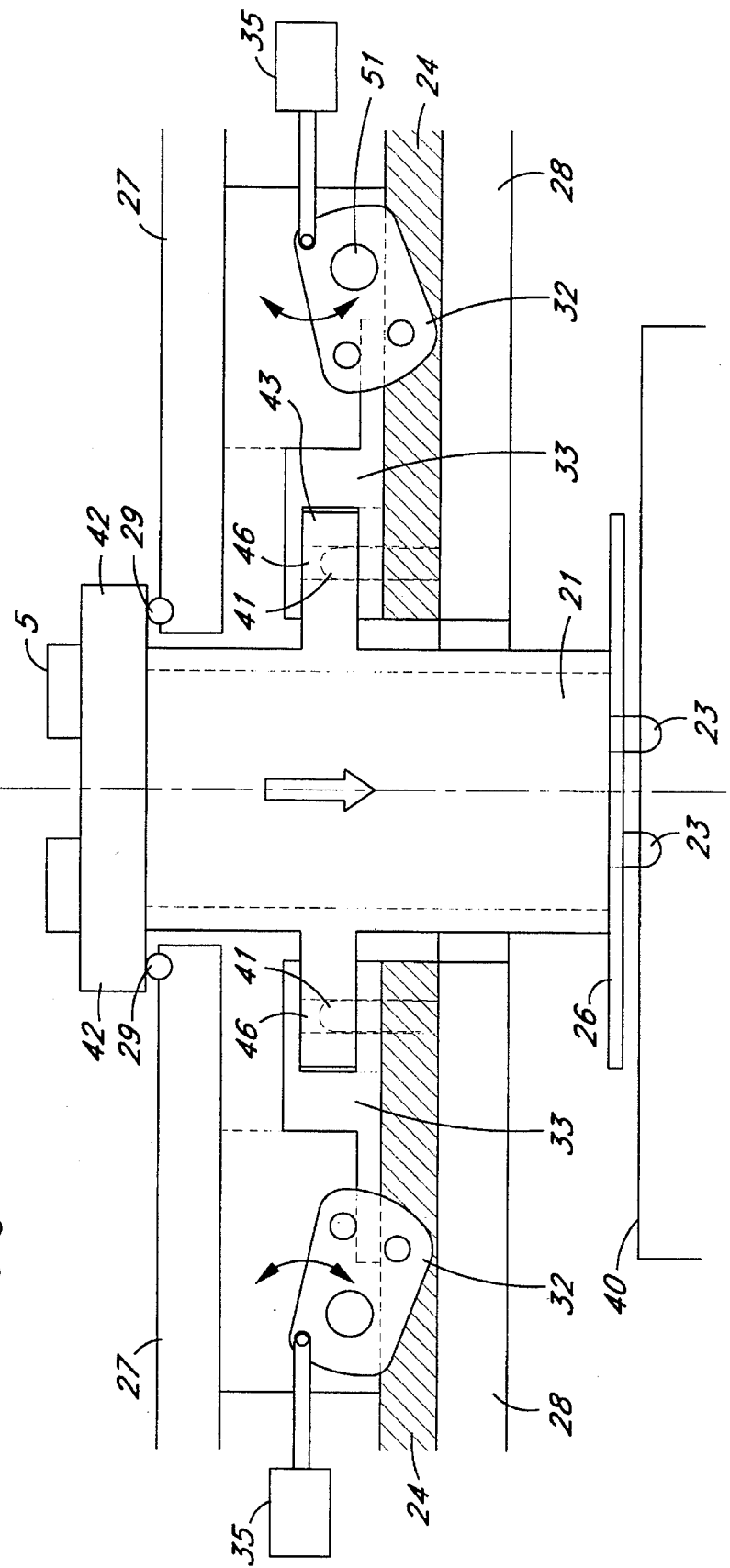
Figure 3:
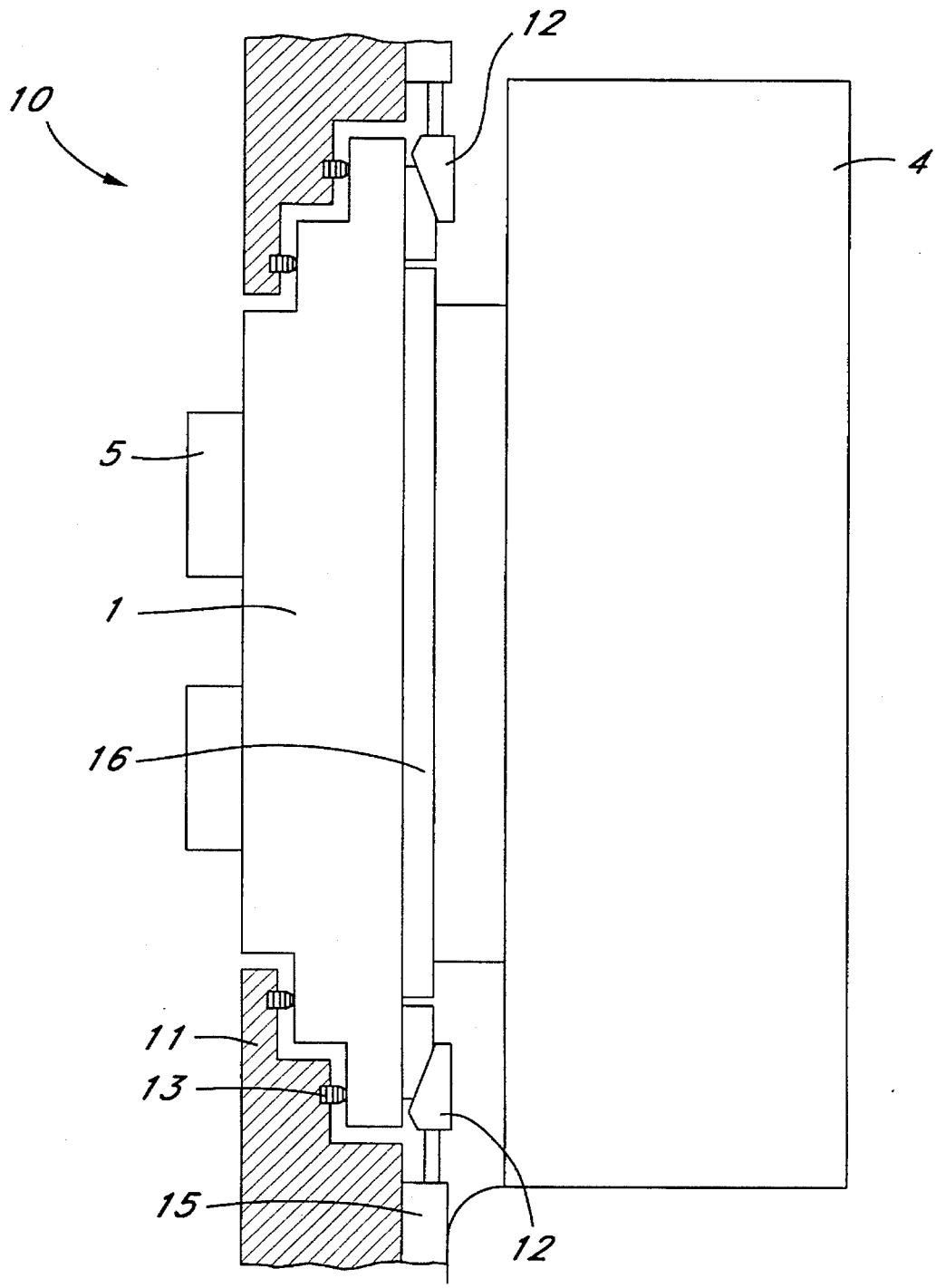
FIG. 3 is a partial sectional view showing a structure of a conventional spacing frame.

Referring to FIGS. 2a and 2b, a more detailed structure and process for installing the spacing frame in the temperature chamber 30 will be described. In the temperature chamber 30, there is provided a locking mechanism comprising clamp cams 32, clamp hooks 33 and air cylinders 35. The air cylinders 35 drive the clamp cams 32 and clamp hooks 33 by a compressed air force in the manner known in the art. The clamp cams 32 rotate around axis 51 in a direction shown by an arrow in FIG. 2b which drives the clamp hooks 33 in a vertical direction. The clamp hooks have openings for receiving the flange 43 of the spacing frame 21. Although not shown, the clamp hooks 33 may preferably include a guide mechanism for providing in accurate movement in the vertical direction when driven by the clamp cams 32.

As shown in FIG. 2b, when installed in the temperature chamber 30, the flange 43 of the spacing frame 21 is clamped by the clamp hooks 33. When inserting or taking out the spacing frame 21 from the IC handler, a clamp switch (not shown) is turned to an OFF state which will makes the air cylinders 35 outwardly pull the clamp cams 32. As a result, the clamp cams 32 rotate in the upward direction and drive the clamp hooks 33 upward. Therefore, the spacing frame 21 is raised in the temperature chamber since the flange 43 is driven upward by the clamp hooks 33.

As shown in FIG. 2b, guide pins 41 are provided on the main base 28 of the temperature chamber 30. When the spacing frame 21 is lowered, the guide pins 41 are inserted in the guide holes 46 to 6 the flange 43 of the spacing frame 21. Conversely, when the spacing frame 21 is raised by the movement of the clamp hooks 33 as above, the guide pins are out of the guide holes 46 of the flange. Further in this situation, the guide pins 23 at the bottom of the performance board 26 do not tough the surface of the test head 40. Namely, the spacing frame 21 is completely free in the temperature chamber. Therefore the spacing frame 21 can be installed or removed in the temperature chamber 30 of the IC handler without touching the test head 40 of the IC tester.

When the clamp switch is turned to ON, the air cylinders 35 push the clamp cams 32 inward which drives the clamp hooks 33 in the chamber 30 downward. As a result, the spacing frame 21 is pushed down by the clamp hooks 33 and the guide pins 41 are inserted in the guide holes 46 of the flange 43. By the combination of the guide pins 41 and the guide holes 46, the spacing frame 21 is precisely aligned in the predetermined position in the temperature chamber 30. At the same time, the guide pins 23 at the bottom of the performance board 26 also meet with guide mechanism (not shown) in the test head to determine the position on the left head so that the electrodes on the performance board 26 accurately contact the contact pins of the test held 40.

In this situation, since the socket guide 42 overlaps the chamber base 27 and tightly contact each other, a tight temperature sealing is accomplished between the temperature chamber and the test head 40. Preferably, the chamber base 27 includes a seal member 29 as shown in FIG. 2b which will provide a better sealing effect in the spacing frame structure of the present invention.

Since the present invention is structured as described above, the spacing frame 21 can be easily replaced without moving the test head or the IC handler. Accordingly, the spacing frame 21 can be exchanged within a significantly short period of time.

What is claimed is:

1. A spacing frame structure for interfacing an IC handler and a test head of an IC tester for testing an IC device, comprising:

a spacing frame body to interface said IC handler and said IC tester, said spacing frame body having a socket guide at its top which is horizontally extended from the body and a flange at its middle portion;

a temperature chamber for providing a predetermined temperature atmosphere for the IC device to be tested, said temperature chamber having an opening for receiving said spacing frame body therein;

a performance board connected to a bottom of said spacing frame body for providing electric signals from the IC device to be tested to said test head of said IC tester;

an IC socket for receiving the IC device to be tested therein, said IC socket being electrically connected to said performance board;

a locking mechanism in said temperature chamber to provide a vertical movement to said spacing frame body, said spacing frame body being free when said locking mechanism places said spacing frame body in an upper position and said spacing frame body is locked when said locking mechanism places said spacing frame body in a lower position;

wherein said spacing frame body is replaceable in parallel with a surface of said test head without moving said IC handler and said test head of said IC tester.

2. A spacing frame structure as defined in claim 1, wherein said spacing frame body further includes a guide hole in said flange, and said temperature chamber further includes a guide pin, said guide hole of said spacing frame and said guide pin engage with each other to determine a position of said spacing frame within said temperature chamber.

3. A spacing frame structure as defined in claim 1, wherein said spacing frame body further includes guide pins at its bottom and extended from said performance board attached to said spacing frame body to determine relative position of said performance board to contact pins of said test head of said IC tester.

4. A spacing frame structure as defined in claim 1, wherein said locking mechanism comprises a cam clamp which is rotatably mounted in said temperature chamber, a clamp hook for clamping said flange of said spacing frame body and a drive mechanism for driving said spacing frame through said clamp cam and said clamp hook.

5. A spacing frame structure as defined in claim 1, wherein said temperature chamber comprises a chamber base and a main base, said locking mechanism being provided between said chamber base and said main base.

6. A spacing frame structure as defined in claim 5, wherein said flange of said spacing frame body is inserted in a space between said chamber base and said main base of said temperature chamber.

7. A spacing frame structure as defined in claim 4, wherein said flange of said spacing frame body is inserted in an opening of said clamp hook when inserted in said temperature chamber.

8. A spacing frame structure as defined in claim 5, wherein said socket guide and said chamber base form a hermetical sealing for insulating temperature in said temperature chamber from said test head.

* * * * *